(12) United States Patent
Lai et al.

(10) Patent No.: US 8,420,948 B2
(45) Date of Patent: Apr. 16, 2013

(54) PRINTED CIRCUIT BOARD

(75) Inventors: Ying-Tso Lai, Taipei Hsien (TW); Yu-Chang Pai, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 323 days.

(21) Appl. No.: 12/973,604

(22) Filed: Dec. 20, 2010

(65) Prior Publication Data

US 2012/0097436 A1    Apr. 26, 2012

(30) Foreign Application Priority Data

Oct. 20, 2010 (TW) .............................. 99135842 A

(51) Int. Cl.
*H05K 1/09*    (2006.01)

(52) U.S. Cl.
USPC ........................................................ 174/257

(58) Field of Classification Search .................. 174/250, 174/252, 255–257, 260–266; 361/792–795
See application file for complete search history.

*Primary Examiner* — Jeremy C. Norris
*Assistant Examiner* — Tremesha S Willis
(74) *Attorney, Agent, or Firm* — Altis Law Group, Inc.

(57) ABSTRACT

A printed circuit board includes a layer. A layer of copper is covered on a surface of the layer. A through hole extends through the printed circuit board. A thermal engraving is defined in the surface of the layer, surrounding the through hole and without being covered by the layer of copper. The thermal engraving includes a first opening and a second opening. The first opening of the thermal engraving faces an output terminal of the power supply, and is non-contiguous with the second opening.

6 Claims, 2 Drawing Sheets

PRINTED CIRCUIT BOARD

CROSS-REFERENCE TO RELATED APPLICATION

Relevant subject matter is disclosed in a pending U.S. patent application which is assigned to the same assignee as named herein, and has an application Ser. No. 12/870,999 and an application data of Aug. 30, 2010.

BACKGROUND

1. Technical Field

The present disclosure relates to a printed circuit board (PCB) and a manufacturing method of the PCB.

2. Description of Related Art

A PCB usually includes a reference layer, which includes copper and a through hole. A component is mounted on the PCB by inserting a pin through the through hole in the PCB and then soldering the pin in place on an opposite side of the PCB during a reflow process. The pin of the component is electrically connected to the reference layer. The reference layer of the printed circuit board distributes heat quickly due to a large surface area of the copper. However, rapid heat dissipation may lead to distortion of the PCB during the soldering process. Therefore there is room for improvement in the art.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
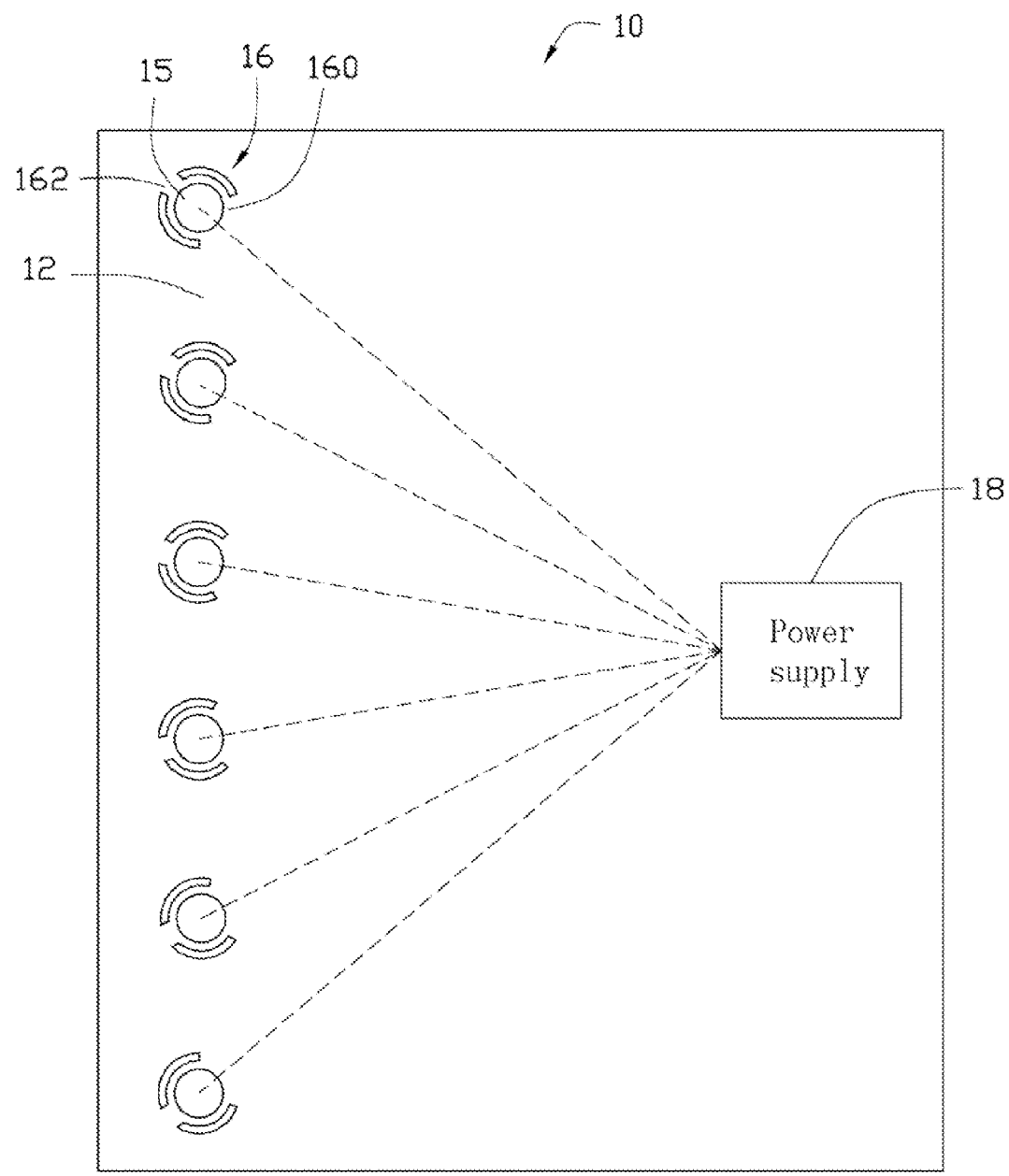
FIG. 1 is a schematic diagram of an exemplary embodiment of a printed circuit board, the printed circuit board defines a thermal engraving.

Referring to FIG. 1, an exemplary embodiment of a printed circuit board (PCB) includes a power supply 18, a power layer 10, and other layers (not shown), such as a ground layer and signal layers. The PCB defines a through hole 15 through the power layer 10 and the other layers. A layer of copper 12 is arranged on a surface of the power layer 10. The power layer 10 defines a thermal engraving 16.

A component (not shown) may be mounted on the PCB by inserting a pin of the component through the through hole 15 and then soldering the pin in place on an opposite side of the PCB. The pin of the component is electrically connected to the power layer 10 and other layers, to transmit signals between layers of the PCB and the component.

The thermal engraving 16 is a groove defined in the surface of the power layer 10 and arranged surrounding the through hole 15. The layer of copper 12 does not cover the thermal engraving 16. The thermal engraving 16 defines a first opening 160 and a second opening 162. The first opening 160 of the thermal engraving 16 faces an output terminal of the power supply 18, and is not contiguous with the second opening 162. In the embodiment, the depth of the thermal engraving 16 is greater than or equal to the thickness of the layer of copper 12. The length of the first opening 160 of the thermal engraving 16 is one third of the length of the groove. The length of the second opening 162 is shorter than the length of the first opening 160.

As a result, when the pin of the component is inserted through the through hole 15, heat dissipation is slower because there is relatively less copper in the area of the through hole 15 due to the existence of the thermal engraving 16. Moreover, because of the first opening 160 of the thermal engraving 16 is directed to the output terminal of the power supply 18, a distance between the pin of the component inserted in the through hole 15 and the output terminal of the power supply 18 has been shortened. As a result, an equivalent resistance between the pin of the component inserted in the through hole 15 and the output terminal of the power supply 18 is reduced. Moreover, the second opening 162 can make the through hole 15 heat evenly.

In other embodiments, the thermal engraving 16 may be arranged in another layer, such as the ground layer of the PCB. In addition, a shape of the groove of the thermal engraving 16 may be changed.

Figure 2:
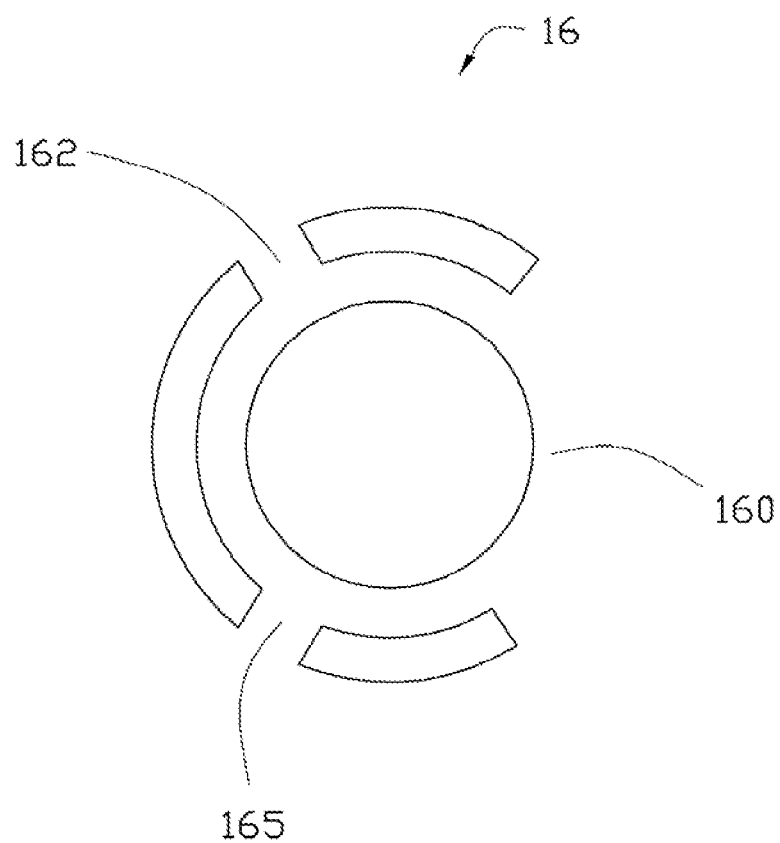
FIG. 2 is another embodiment of the thermal engraving of FIG. 1.

Referring to FIG. 2, in another embodiment, the thermal engraving 16 may include a first opening 160 facing the output terminal of the power supply 18, a second opening 162, and a third opening 165. The first opening 160 is not contiguous with the second opening 162 and the third opening 165. The second opening 162 is not contiguous with the third opening 165. Moreover, in other embodiments, the thermal engraving 16 may include more than three openings.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A printed circuit board comprising a layer and a power supply, the layer comprising:
   a layer of copper arranged on a surface of the layer;
   wherein a through hole extends through the printed circuit board; and
   wherein a thermal engraving is defined in the surface of the layer and surrounds the through hole without being covered with the layer of copper, the thermal engraving includes a first opening and a second opening, the first opening of the thermal engraving faces an output terminal of the power supply and is not contiguous with the second opening.

2. The printed circuit board of claim 1, wherein a depth of the thermal engraving is greater than or equal to a thickness of the layer of copper.

3. The printed circuit board of claim 1, wherein the layer is a power layer.

4. The printed circuit board of claim 1, wherein the second opening is shorter than the first opening.

5. The printed circuit board of claim 1, wherein the thermal engraving further comprises a third opening, the third opening is non-contiguous with the first opening and the second opening.

6. The printed circuit board of claim 5, wherein the third opening is shorter than the first opening.

* * * * *